US006961160B2

United States Patent
Yoshinari

(10) Patent No.: US 6,961,160 B2
(45) Date of Patent: Nov. 1, 2005

(54) RECORDING MATERIAL FOR HOLOGRAMS, MANUFACTURING METHOD THEREOF, RECORDING MEDIUM FOR HOLOGRAMS, HOLOGRAM RECORDING METHOD AND HOLOGRAM REPRODUCTION METHOD

(75) Inventor: Jiro Yoshinari, Chuo-ku (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/785,016

(22) Filed: Feb. 25, 2004

(65) Prior Publication Data

US 2004/0233486 A1 Nov. 25, 2004

(30) Foreign Application Priority Data

Feb. 28, 2003 (JP) ........................................ 2003-054990

(51) Int. Cl.$^7$ ................................................. G03H 1/02
(52) U.S. Cl. ........................ 359/7; 359/3; 359/1; 430/1
(58) Field of Search .......................... 359/3, 7, 1; 430/1, 430/2, 290

(56) References Cited

U.S. PATENT DOCUMENTS 6,524,771 B2 * 2/2003 Maeda et al. ............... 430/290

2004/0036932 A1 * 2/2004 Korzinin et al. ............... 359/7

OTHER PUBLICATIONS

Sukhanov; "Porous glass as a Storage medium"; 1994 Optica Applicata, vol. 24 No. 1–2.*

Hideo Tanigawa et al.; "Holographic Recording Material"; Journal of the Society of Photographic Science and Technology of Japan, 1997, vol. 60; pp 293–301.

D.A. Waldman et al.; "Holographic recording properties in thick films of ULSH–500 photopolymer": SPIE, 1998, 3291, pp 89–103.

* cited by examiner

Primary Examiner—Fayez G. Assaf
(74) Attorney, Agent, or Firm—Oliff & Berridge, PLC

(57) ABSTRACT

A recording material for holograms includes a metal oxide porous body with an oxygen donor substance in the pores. In addition, a method manufactures a recording material for holograms that include a metal oxide porous body with an oxygen donor substance in the pores. The method includes forming a metal oxide porous body from a metal oxide precursor, and supplying an oxygen donor substance to the pores of the metal oxide porous body.

21 Claims, 4 Drawing Sheets

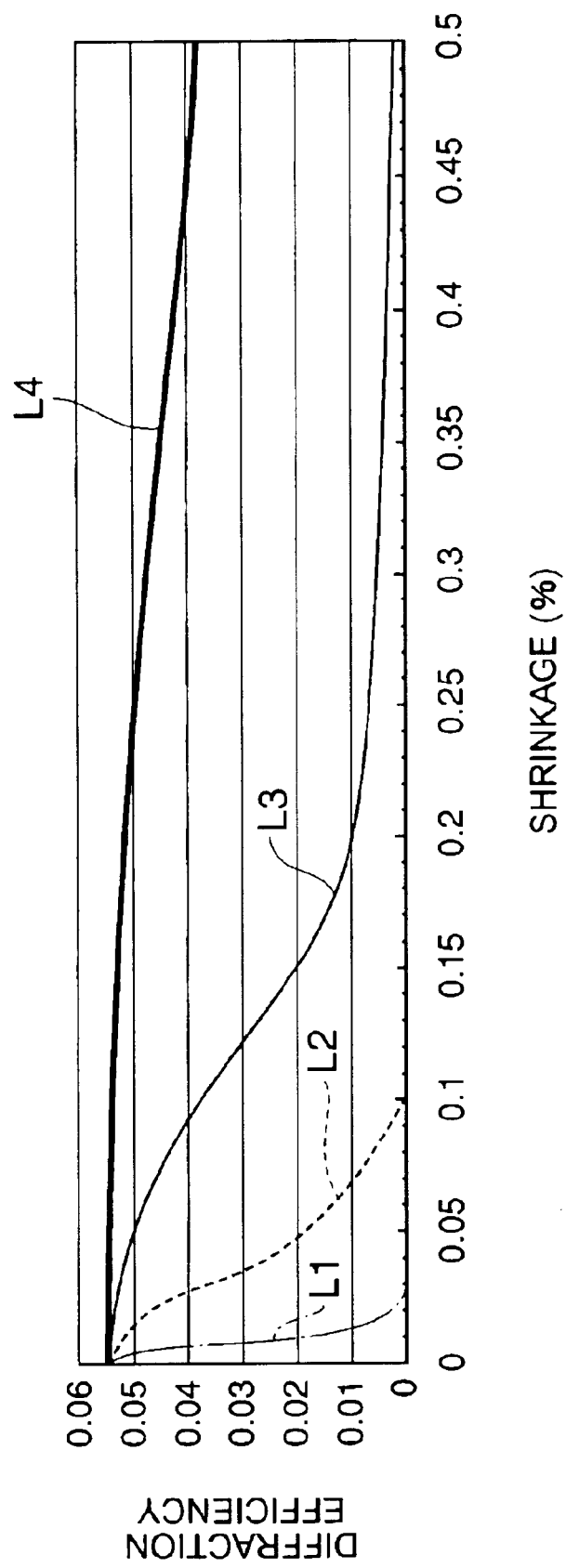

RECORDING MATERIAL FOR HOLOGRAMS, MANUFACTURING METHOD THEREOF, RECORDING MEDIUM FOR HOLOGRAMS, HOLOGRAM RECORDING METHOD AND HOLOGRAM REPRODUCTION METHOD

BACKGROUND OF THE INVENTION

1. Field of the Invention

The present invention relates to a recording material for holograms, a manufacturing method thereof, a recording medium for holograms, a hologram recording method and a hologram reproduction method.

2. Related Background Art

Recording media used for computers and the like are generally optical recording media wherein information is recorded by deformation, magnetic domain changes or phase changes produced by laser irradiation of the recording layer, and they are widely employed as CDs and DVDs. Such optical recording media which have been implemented include write-once read-multiple recording media employing organic dye and the like, magneto-optical recording media employing rare earth-transition metal amorphous magnetic films, and phase change optical recording media employing chalcogenide films. In optical recording media of these types, the changes mentioned above are produced when the optical energy of the irradiated laser is converted to heat.

Achieving larger capacities of recording media has been a constant goal with the increase in advanced information in recent years, but the optical recording materials mentioned above have been associated with several limitations. Specifically, with conventional optical recording materials the recording is accomplished with the laser focused using lenses. Since the spot diameter of the focus usually cannot be smaller than ½ of the wavelength of the irradiated light, this has constituted a limit for the volume of data that can be recorded in a given area (recording density), and therefore the capacities of the recording media overall have been restricted.

In recent years, recording media utilizing holography have become noted as recording media allowing high capacities exceeding those of conventional optical recording media. Holography is a method of recording/reproduction whereby light carrying image information (an object beam) and light irradiated directly from a light source (a reference beam) are irradiated from different angles and superposed inside the recording material of the recording medium, an interference grating is recorded in the recording material by the resulting interference, the same light as the reference beam (reproduction light) is irradiated onto the recording material and diffraction of the reproduction light by the interference grating produces light equivalent to the object beam to reproduce the image information. Images recorded as interference gratings by holography are referred to as holograms, and they include information relating to the amplitude and phase of the object light.

This recording principle has been applied for holographic recording of data into recording materials in order to provide optical recording materials suitable for data recording in computers and the like. In this case, the information-carrying beam is digitalized and modulated with a spatial light modulator, and the modulated light (signal beam) is interfered with a reference beam to produce an interference pattern which is recorded in the hologram. The signal beam is reproduced by irradiation of the same light as the reference beam (reproduction light), and the original information can be restored by decoding this beam.

Such holograms have very narrow diffraction angle dependency, and thus the information beam cannot be reproduced if the reference beam angle is even slightly shifted. On the other hand, however, this means that multiple holograms can be recorded in the same volume by slightly shifting the angle of the reference beam during recording, i.e. multiplex recording is possible, and therefore holograms offer the prospect of large-volume recording. Such multiplex recording systems are known, such as angular multiplexed systems wherein the incident angle of the reference beam is varied, or spherical shift multiplexed systems wherein the reference beam is converted to a spherical wave and the recording medium is displaced.

Typical known recording materials used for such holograms include silver chloride emulsions, dichromated gelatin, photopolymers, electrooptical crystals, photoresists, thermoplastics, photochromics and the like (for example, H. Tanigawa, T. Ichihashi, Journal of the Society of Photographic Science and Technology of Japan, 1997, Vol.60, p.293–301).

For utilization as recording materials, from the standpoint of production and preventing reduction in resolving power it is preferred for such materials to be in a reproducible state immediately after light irradiation, without requiring separate development or other post-treatment. However, the aforementioned silver chloride emulsion, dichromated gelatin, photoresist and thermoplastic recording materials require developing treatment after light irradiation.

A recording material must also be of a type which does not result in corruption of data during reproduction. Of the recording materials mentioned above, electrooptical crystals and photochromics are the most convenient materials because once a hologram has been recorded the recording can be erased if the same location is irradiated with light or heated to a stronger degree than at the time of recording, and they are therefore reusable. However, this also means that recorded data can be erased by irradiation of the reproduction light, and in fact it is known that repeated reproduction results in gradual corruption of data.

Recently, self-developing photopolymerizing photopolymers have attracted attention as recording materials for holograms which satisfy the aforementioned requirements. A photopolymer is generally composed of a composition obtained by adding a photoinitiator, sensitizing agent and the like to a mixture of a photopolymerizing monomer and a binder polymer. In a photopolymerizing photopolymer, initial light irradiation induces a photopolymerization reaction at the irradiated section producing a concentration gradient of the monomer in the composition, such that the monomer migrates in the composition. The finally obtained polymer has a different structure at the light-irradiated sections and the non-irradiated sections, and recording of the hologram is achieved by the difference in refractive index based on this difference in structure. Such photopolymerizing photopolymers do not require treatment such as development since the change in refractive index is produced by light irradiation alone, and since the state is virtually unchanged even with light irradiation once the entirety has been polymerized, such photopolymers are therefore stable with respect to the reproduction light as well.

Nevertheless, photopolymerizing photopolymers tend to undergo volume shrinkage during photopolymerization, and this has produced recording distortions in some instances.

Considerable research has therefore been conducted on methods for reducing volume shrinkage, and as one example there is known a recording method which utilizes ring-opening polymerization reaction with a cationic monomer (for example, D. A. Waldman, H.-Y. S. Li, E. A. Cetin, SPIE, 1998, 3291, 89).

SUMMARY OF THE INVENTION

Recording materials for holograms are practical only if they possess the aforementioned properties in combination with the property of high diffraction efficiency, or in other words, the property such that a large proportion of the light in the irradiated reproduction light is effectively used for reproduction of the reproduced image (data). High diffraction efficiency results in a bright reproduced image and thus highly reproducible reading of recorded data.

The aforementioned photopolymerizing photopolymers accomplish recording of holograms by varying the refractive index based on the difference in structure of the polymer produced by photopolymerization, but since the produced refractive index difference between the light-irradiated sections and non-irradiated sections is not sufficiently large, it has been difficult to obtain a practical level of diffraction efficiency.

Investigation by the present inventors has indicated that heat also causes volume expansion or shrinkage of recording materials for holograms, resulting in lower diffraction efficiency. Since the aforementioned photopolymerizing photopolymers are made of organic materials, their volume fluctuations in response to heat are particularly notable. Photopolymerizing photopolymers therefore undergo volume flucutations not only during photopolymerization but also in response to reproduction light irradiation-induced heat or changes in environmental temperature, and these are also often the causes of reduced diffraction efficiency. With recording materials for holograms employing such photopolymerizing photopolymers, therefore, it has been difficult to avoid corruption of recorded data with time due to repeated reproduction or prolonged storage of the recording media.

FIG. 4 is a graph showing changes in diffraction efficiency with respect to volume shrinkage of recording materials for holograms (shrinkage-diffraction efficiency curves) where photopolymerizing photopolymers were used as the recording materials and multiplex recording was carried out using a transmission-type angular multiplexed system or a reflection-type spherical shift multiplexed system. In FIG. 4, L1 and L2 are curves obtained using recording materials with thicknesses of 1000 $\mu$m and 200 $\mu$m in a reflection-type spherical shift multiplexed system, and L3 and L4 are curves obtained using recording materials with thicknesses of 1000 $\mu$m and 200 $\mu$m in a transmission-type angular multiplexed system. As seen in this graph, it was confirmed that diffraction efficiency is reduced with shrinkage of the recording material and that this tendency is particularly notable in a reflection-type spherical shift multiplexed system.

The present invention has been completed in light of the circumstances described above, and its object is to provide a recording material for holograms which allows large-volume recording and is capable of reduced corruption of recorded data with time, as well as a process for its fabrication, a recording medium for holograms, a hologram recording method and a hologram reproduction method.

In order to achieve the aforementioned object, the recording material for holograms according to the present invention is characterized by comprising a metal oxide porous body provided with an oxygen donor substance in the pores. In this type of recording material, it is believed that the action of the oxygen donor substance and metal oxide porous body increases the oxygen content of the metal oxide porous body at the recording light-irradiated sections, thereby producing a change in the refractive index of the meal oxide porous body.

Specifically, the recording material for holograms according to the invention is characterized in that the metal oxide porous body has an increased oxygen content produced by oxygen from the oxygen donor substance generated by irradiation of recording light composed of a signal beam and a reference beam. This manner of recording material for holograms requires no procedures such as development since recording can be accomplished simply by irradiation of light. Moreover, since the recording material for holograms of the invention is composed mainly of an inorganic metal oxide, very little volume expansion or shrinkage occurs by the heat of the reproduction light irradiation or by changes in the surrounding temperature. In addition, once oxygen has been donated to the metal oxide porous body, it will be resistant to any further increase in oxygen content even when irradiated with light and therefore corruption of data, etc. is negligible even with repeated irradiation of the reproduction light.

At least a portion of the surface of the metal oxide porous body in contact with the oxygen donor substance preferably consists of the metal oxide capable of increased oxygen content and/or the constituent metal element of the metal oxide (the sites of the metal oxide or metal element will hereinafter be referred to as "oxygen-deficient sites"). When such oxygen-deficient sites are present, contact between the oxygen donor substance in the pores and the oxygen-deficient sites is facilitated, thereby promoting reaction between the oxygen donor substance-derived oxygen and the oxygen-deficient sites. The oxygen-deficient sites to which oxygen has bonded are thus converted to a chemical composition similar to that of the constituent metal oxide of the metal oxide porous body. The oxygen content therefore increases in the light-irradiated sections with respect to the surrounding metal oxide porous body, thereby producing a refractive index difference between the light-irradiated sections and non-irradiated sections.

More specifically, the oxygen donor substance is preferably water. Also, the constituent metal element of the metal oxide porous body is preferably at least one metal element selected from the group consisting of B, Mg, Al, Ca, Ti, Cr, Zn, Sr, Zr, Nb, Mo, Sn, Sb, Te, Ba, La, Ce, Nd, Eu, Gd, Tb, Dy, Ho, Er, Tu, Yb and Lu, and most preferably Te.

The oxygen content increase in the recording material for holograms in the absence of irradiation of the recording light is preferably not of a level which is detectable by the reproduction light. That is, in the absence of irradiation of the recording light, the change in refractive index induced by the increase in oxygen content is preferably not of a level which can affect reproduction. If this condition is satisfied, then the reproduction light will not be able to detect changes in the recording material for holograms even when increase in the oxygen content of the recording material occurs due to irradiation of light other than the recording light either before recording or after recording, such as irradiation of natural light during storage or irradiation of the reproduction light during reproduction, so that substantially no corruption will occur either before recording or after recording of the recording material.

The metal oxide porous body is preferably a metal oxide porous body which is capable of transmitting the recording light. The transmittance with respect to the recording light may be 20% or greater, and is preferably 50% or greater. A metal oxide porous body with this property will allow multiple recordings in the same material if the recording light is irradiated at a different irradiation position with respect to the same recording material for holograms, and specifically if, for example, the irradiation position is varied in the direction of depth.

The method for manufacturing a recording material for holograms according to the present invention is a method for satisfactory fabrication of a recording material for holograms according to the invention, and it is characterized by having a step of forming a metal oxide porous body from a metal oxide precursor, and a step of supplying an oxygen donor substance to the pores of the metal oxide porous body. Water is preferred as the oxygen donor substance used for the fabrication process. The metal oxide precursor is preferably a metal alkoxide, and most preferably a tellurium alkoxide.

A recording medium for holograms according to the invention is a recording medium for holograms provided with at least a substrate material and a recording layer formed on the substrate material, wherein the recording layer comprises a recording material for holograms according to the invention. Since a recording material for holograms according to the invention is used as the material of the recording layer, the obtained recording medium allows convenient recording and reproduction while exhibiting properties such as excellent stability during storage.

The invention further provides a hologram recording method whereby data is recorded in a recording medium for holograms according to the invention. The method has a recording step in which the recording layer of a recording medium for holograms according to the invention is irradiated with recording light composed of a signal beam and a reference beam to increase the oxygen content of the metal oxide porous body with oxygen from the oxygen donor substance generated by irradiation of the recording light in the recording layer.

According to this type of hologram recording method it is possible to obtain a multiplex-recorded medium, in which case the irradiation angle of the recording light on the recording layer is varied to increase the oxygen content of the metal oxide porous body in the direction of depth of the recording layer based each irradiation angle.

Furthermore, the information recorded in the recording medium for holograms as obtained by the recording method described above can be read by a hologram reproduction method having a reproduction step in which the recording medium for holograms is irradiated with reproduction light.

BRIEF DESCRIPTION OF THE DRAWINGS

FIG. 4 is a graph showing changes in diffraction efficiency with respect to volume shrinkage of recording materials for holograms.

DESCRIPTION OF THE PREFERRED EMBODIMENTS

Figure 1:
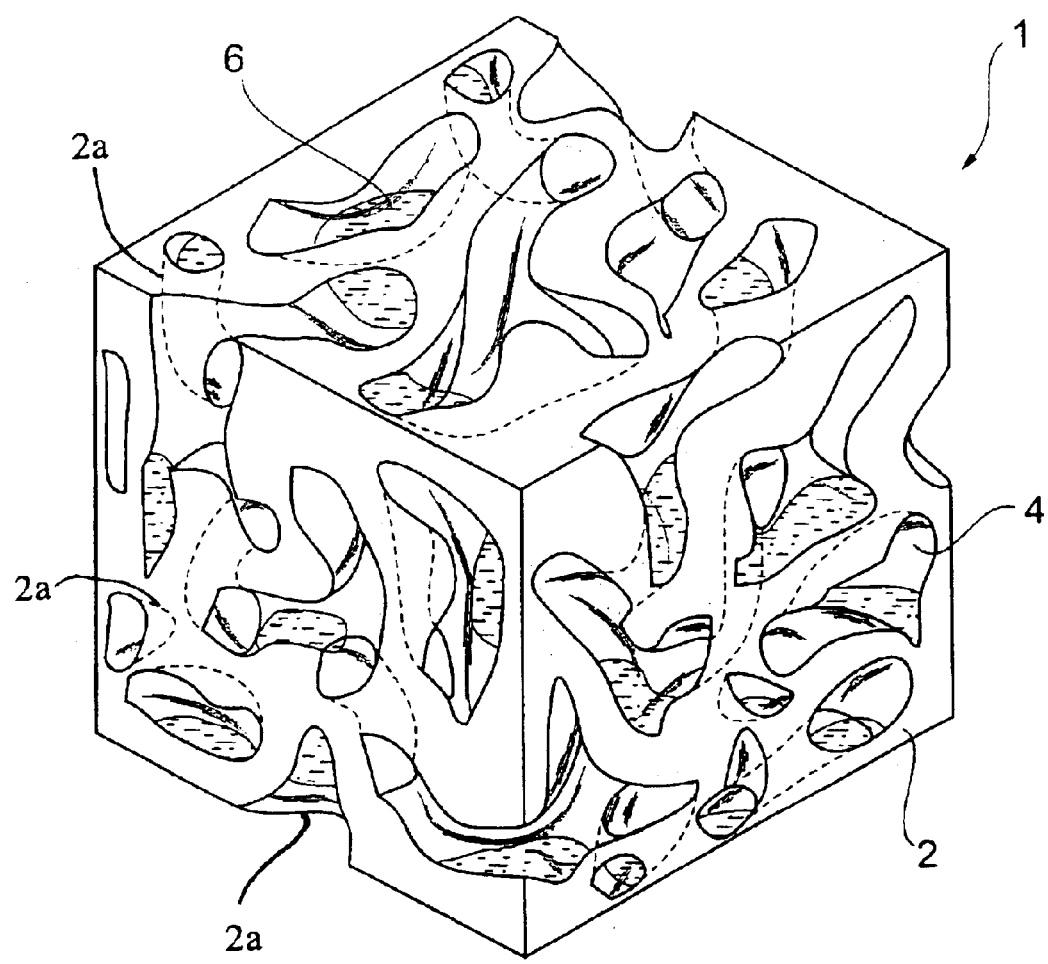
FIG. 1 is a schematic perspective view of a portion of the typical structure of a recording material for holograms according to the invention.

Preferred embodiments of the present invention will now be explained in detail with reference to the accompanying drawings. Similar elements will be indicated by like reference numerals and will be explained only once.

Figure 2:
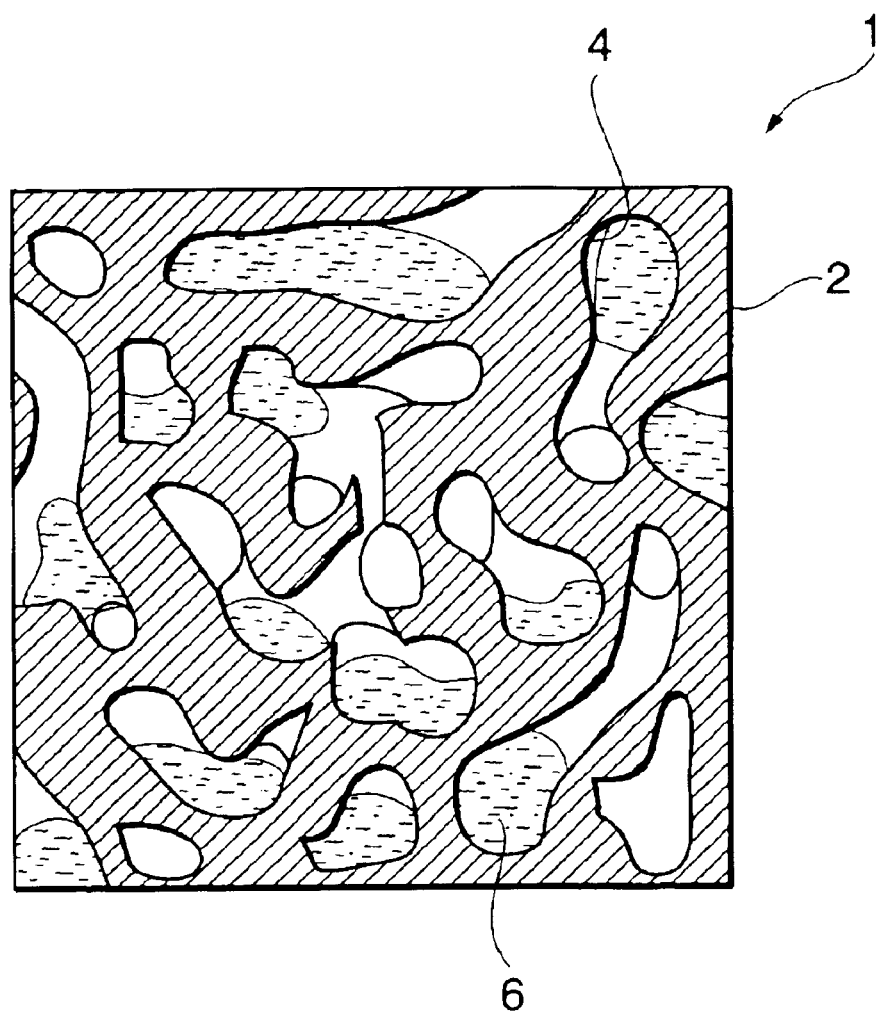
FIG. 2 is a longitudinal cross-sectional view of the recording material for holograms 1 shown in FIG. 1.

FIG. 1 is a schematic perspective view of a portion of the typical structure of a recording material for holograms according to the present invention, and FIG. 2 is a longitudinal cross-sectional view of the recording material for holograms 1 shown in FIG. 1. The recording material for holograms 1 shown in the drawings comprises a metal oxide porous body 2 provided with an oxygen donor substance 6 in the pores 4.

The metal oxide porous body 2 is made of a metal oxide, and multiple fine holes (pores 4) are formed on the surface and in the interior. As shown here, pores 4 which are independently formed and those which form continuous hollow sections are present, and they may be in any desired proportion. Examples of constituent metal oxides for the metal oxide porous body 2 include oxides of B, Mg, Al, Ca, Ti, Cr, Zn, Sr, Zr, Nb, Mo, Sn, Sb, Te, Ba, La, Ce, Nd, Eu, Gd, Tb, Dy, Ho, Er, Tu, Yb and Lu. Preferred oxides are those of Ag, Hg, Te, Cu, Pb, Sb, Co, Ni, Sn and Mo, and metal oxide porous bodies composed of these oxides typically have the respective chemical compositions $Ag_2O$, $Hg_2O$, $TeO_2$, $Cu_2O$, $PbO$, $Sb_2O_3$, $CoO$, $NiO$, $SnO_2$ and $MoO_2$.

The recording material for holograms 1 is preferably one which is transparent at least with respect to the recording light, and more preferably it is one whose transparency is improved after irradiation of the recording light. From this standpoint, oxides of Te, Sb, Sn and Mo are preferred. From the standpoint of low toxicity to the environment, oxides of Ag, Te, Cu, Ni, Sn and Mo are preferred.

Since the properties of the metal oxide porous body 2 will differ depending on the metal oxide used, selection may be as appropriate for the intended use and purpose, but oxides of Te, Cu, Ni, Sn and Mo are suitable from both standpoints mentioned above, with Te oxides being most preferred.

A portion of the structure of the metal oxide porous body 2 consists of the metal oxide which is capable of increased oxygen content and/or the constituent metal element of the metal oxide (oxygen-deficient sites), and most preferably these are present in the walls of the pores 4. The constituent metal oxide of the metal oxide porous body 2 is a metal oxide which can stably exist under ordinary conditions such as room temperature, and an example thereof is Te oxide, or $TeO_2$. The oxygen-deficient sites consist of either the metal or the metal oxide with fewer oxygen atoms bonded than in the chemical composition of the stable metal oxide, and in the case of Te oxide this corresponds to $TeO_x$ ($0 \leq x < 2$), and typically Te.

Figure 3:
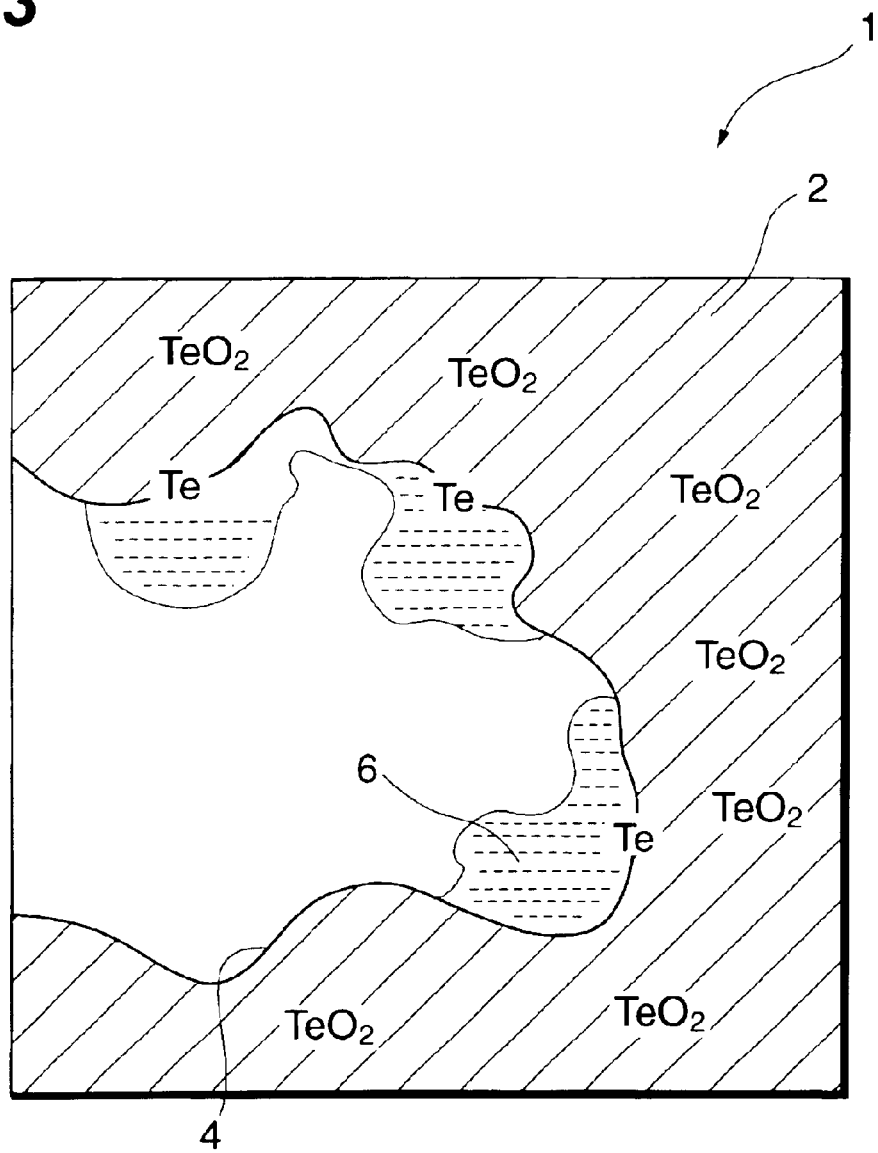
FIG. 3 is a conceptual cross-sectional view of an example of the surroundings of a pore 4 in a metal oxide porous body 2.

FIG. 3 is a conceptual cross-sectional view of an example of the surroundings of a pore 4 in a metal oxide porous body 2. In FIG. 3, the metal oxide porous body 2 is composed of $TeO_2$, and oxygen-deficient Te metal is exposed from $TeO_2$ at the walls of the pore 4. That is, the walls of the pore 4 are defined by corresponding portions of an outer boundary 2a of the metal oxide porous body 2, as shown in FIG. 1. Water as the oxygen donor substance 6 explained below adheres to the exposed Te.

The oxygen-deficient sites of the metal oxide porous body 2 are formed simultaneously with fabrication of the metal oxide porous body 2, but an oxygen-deficient material having the same chemical composition as the oxygen-deficient sites may also be added or formed separately. Specifically, if the metal oxide porous body 2 is composed of $TeO_2$, for example, Te metal may be added separately as an oxygen-deficient material. In this case, the amount of oxygen-deficient sites in the metal oxide porous body 2 may be increased as desired, in order to facilitate control of the oxygen increase by irradiation with the recording light.

The oxygen donor substance 6 in the pores 4 of the metal oxide porous body 2 reacts with the metal oxide porous body 2 upon irradiation of the recording light, giving up its oxygen. As oxygen donor substances 6 having such a property there may be mentioned water, hydrogen peroxide, and acids such as acetic acid, with water being preferred.

The recording material for holograms 1 comprising the metal oxide porous body 2 and oxygen donor substance 6 described above records an interference pattern produced by interference of recording light composed of two beams at the irradiated sections, by changes in its property corresponding to the distribution of light/dark intensity in the interference pattern. The changes in this case are increases in the oxygen content of the metal oxide porous body 2 with oxygen from the oxygen donor substance 6 by irradiation of the recording light, and the increases in oxygen content are produced by bonding of the oxygen from the oxygen donor substance 6 to the oxygen-deficient sites exposed at the walls of the pores 4. This oxygen content increase creates a refractive index difference between the recording light irradiated sections and non-irradiated sections. Because the degree of oxygen content increase varies in correspondence to lightness/darkness of the interference pattern, the variation in refractive index is also in correspondence, thus allowing recording of the interference pattern.

Although the detailed mechanism whereby oxygen is generated from the oxygen donor substance 6 by irradiation of the recording light and binds to the oxygen-deficient sites is not yet fully understood, it is believed that it occurs by the reactions represented by the following reaction formulas (1) to (5). These reaction formulas are examples where the metal oxide is Te oxide and the oxygen donor substance is water. The $TeO_x$ in the reaction formulas is Te oxide where $0 \leq x < 2$.

$$H_2O \leftrightarrow H^+ + OH^- \tag{1}$$

$$TeO_x \rightarrow TeO_x + h^+ + e^- \tag{2}$$

$$2h^+ + 2OH^- \rightarrow H_2O_2 \tag{3}$$

$$2e^- + 2H^+ \rightarrow H_2 \tag{4}$$

$$Te + H_2O_2 \rightarrow TeO_2 + H_2 \tag{5}$$

In the above reaction formulas, the oxygen donor substance 6 (water) near the walls of the pores 4 of the metal oxide porous body 2 initially exists in the state of $H_2O$ molecules and their dissociated or polarized state of $H^+$ ions and $OH^-$ ions, and these two states are mutually interchangeable (Formula 1). Irradiation of light on the metal oxide porous body 2 causes excitation of the oxygen-deficient $TeO_x$ ($0 \leq x < 2$) sites and generates electron/positive hole pairs (Formula 2). The generated positive holes react with the $OH^-$ ions to produce $H_2O_2$ which is an oxygen donor, while the generated electrons react with the $H^+$ ions to produce hydrogen (Formulas 3, 4). The generated $H_2O_2$ donates oxygen to the Te atoms constituting some of the oxygen-deficient sites exposed on the walls of the pores 4, producing $TeO_2$ (Formula 5).

In the recording material for holograms 1, therefore, it is conjectured that irradiation of the recording light causes excitation of the oxygen-deficient sites in the metal oxide porous body 2 whereby electron/positive hole pairs are generated, and that anions dissociated from the oxygen donor substance are oxidized by the generated positive holes to produce substances with greater oxygen donating power, thus resulting in binding of oxygen to the oxygen-deficient sites. However, the reaction mechanism is not limited to this theory.

The oxygen content increase in the metal oxide porous body 2 of the recording material for holograms 1 in the absence of recording light irradiation preferably does not occur to a level which is detectable by reproduction light. Specifically, under ordinary conditions such as room temperature, the oxygen donor substance 6 preferably does not undergo the reaction of directly donating oxygen to the oxygen-deficient sites. For this reason, the oxygen donor substance 6 is preferably selected so that it has no power to donate oxygen to the oxygen-deficient sites under ordinary conditions, or in other words, so that the free energy of formation by its reaction with the oxygen-deficient sites is positive.

The oxygen-binding reaction at the oxygen-deficient sites by oxygen from the oxygen donor substance 6 preferably does not occur by causes other than recording light irradiation, such as irradiation of natural light during storage or irradiation of the reproduction light during reproduction. For this reason, it is preferred to use a metal oxide porous body 2 having a small energy gap (energy gap between the ground electronic state and excited electronic state, same hereunder) before oxygen donation and a large energy gap after oxygen donation, with respect to the energy of the recording light, as explained below.

As regards the sizes of the pores 4 in the metal oxide porous body 2, the sizes of the pores 4 are preferably smaller than the wavelength of light used for recording and reproduction. Such a construction will help prevent light scattering at the interface between the metal oxide porous body 2 and the oxygen donor substance 6, to minimize the resultant reduction in diffraction efficiency. The sizes of the pores 4 may be controlled by employing a publicly known method for production of a metal oxide porous body 2.

A recording material for holograms 1 having such a construction may be fabricated by the following process. First, the metal oxide porous body 2 is produced from a precursor of the metal oxide. The production may be accomplished by applying a conventional publicly known process allowing production of porous metal oxides, with no particular restrictions, but the metal oxide porous body 2 of the invention is preferably formed by a sol-gel process.

When the production is by a sol-gel process, a metal alkoxide is first used as the metal oxide precursor and dissolved or dispersed in a solvent. To this solution there are added a hydrolysis-capable substance such as water and if necessary a catalyst such as an acid, for hydrolysis reaction of the precursor. The precursor undergoes partial polymerization by the hydrolysis reaction to form a partially polymerized oligomer as a stable sol.

Next, the solvent is removed from the obtained sol and the sol is concentrated to a gel. The solvent removal may be carried out at ordinary temperature or the obtained gel may be further heated at a temperature which does not produce crystals, but for most purposes the sol is transferred to a substrate and allowed to stand in air.

The obtained gel is then heated in a reducing atmosphere to form a metal oxide porous body 2 having oxygen-deficient sites in at least some portions. Here, a reducing atmosphere means an atmosphere in which oxidation of the metal oxide porous body 2 does not occur, and specifically the heating may be in a nitrogen atmosphere. Heating in such a reducing atmosphere produces a metal oxide porous body 2 having oxygen-deficient sites in at least some portions, which comprise a metal oxide with a chemical composition allowing further bonding of oxygen, or the metal. In the case of separate addition of an oxygen-deficient material, it may be added during dissolution or dispersion of the precursor of the metal oxide porous body 2 in the solvent, or it may be added in the aforementioned sol state or gel state.

The metal oxide porous body 2 obtained in the manner described above is saturated in a solution of the oxygen donor substance 6 or else the oxygen donor substance 6 is injected into the metal oxide porous body 2, in order to supply the oxygen donor substance 6 into the pores 4 to obtain the recording material for holograms 1.

The recording medium for holograms according to the invention is provided with at least a substrate and a recording layer for holograms of the invention formed on the substrate. A recording medium for holograms having such a construction may be fabricated in the following manner. First, the process for fabrication of a recording material for holograms as described above is carried out to obtain a sol containing a partial polymer of the precursor of the metal oxide porous body 2.

The obtained sol is then coated onto a substrate. The coating is accomplished, for example, by a method of dropping the sol onto the substrate or by a conventional publicly known method such as spin coating. Next, the solvent is removed from the coated sol to form a gel. The gel formed on the substrate is heated in a reducing atmosphere to form the metal oxide porous body 2. The oxygen donor substance 6 is then supplied to the pores 4 of the metal oxide porous body 2 formed on the substrate to form a recording layer composed of the recording material for holograms 1, as a reducing medium for holograms. In this fabrication process, removal of the solvent, heating and supplying of the oxygen donor substance 6 may be carried out in the same manner as for the aforementioned method for fabrication of a recording material for holograms.

The recording material for holograms or recording medium comprising it according to the present invention is used for recording and reproduction of holograms. An example of a recording and reproduction method will now be described. For recording of a hologram, a signal beam modulated in correspondence with information data and a non-modulated reference beam are irradiated at different angles as recording light onto a recording material for holograms according to the invention (the recording material for holograms may also be a layer formed on a substrate material, i.e. a recording layer of a recording medium for holograms, same hereunder). The signal beam used is light obtained by transmission or reflection of digitalized information such as image data displayed as bit data in a spatial light modulator. The reference beam used is light having a phase and wavelength which interfere with the signal beam, and it is irradiated on the recording material from a different angle than the signal beam.

An interference pattern is produced by interference of the signal beam and reference beam at the recording light irradiation site, and the interference pattern is recorded in the recording material as alterations in the state of the recording material for holograms which are produced in correspondence to the lightness/darkness of the interference pattern, to obtain a hologram-recorded material (or hologram-recorded medium). The alterations are increases in the oxygen content of the metal oxide porous body 2 of the recording material for holograms, induced by the mechanism described above, and the degrees of increase correspond to the lightness/darkness of the interference pattern.

The information recorded in this manner may be reproduced by irradiating reproduction light having the same wavelength and phase as the reference beam at the position of the recording material for holograms in which the recording light was irradiated, at the same irradiating position and from roughly the same direction as the reference beam. The irradiated reproduction light is diffracted by the interference grating recorded in the recording material to produce light approximately equivalent to the signal beam, which may be decoded to read the original information.

This type of hologram recording method also allows multiplex recording. As multiplex recording methods there may be mentioned angular multiplexed systems wherein the incident angle of the reference beam is varied, or spherical shift multiplexed systems wherein spherical light is used as the reference beam and the position of the recording material for holograms is gradually varied. Also, the irradiating position of the recording light on the recording material for holograms may be varied to allow multiple recordings in the depthwise direction of the same recording material.

In the hologram recording and reproduction method described above, the photon energy of the recording light is preferably larger than the energy gap of the recording material for holograms before its alteration and the photon energy of the reproduction light is preferably smaller than the energy gap of the recording material for holograms after its alteration. Consequently, the metal oxide porous body used preferably has an energy gap which before alteration is smaller and an energy gap which after alteration is larger than the photon energy of the light used as the recording light and reproduction light. For example, when an Nd-YAG laser is used as the recording light and reproduction light, a metal oxide with an energy gap of less than 2.33 eV before alteration and an energy gap of at least 2.33 eV after alteration is used.

The function and effect produced by using the recording material for holograms 1 of the present invention described above will now be explained for an example wherein a metal oxide porous body 2 composed of $TeO_2$ containing Te metal element in some portions is used and water is used as the oxygen donor substance 6. First, the recording material for holograms 1 is designed so that Te in the recording light-irradiated sections is excited and reaction between the excited Te and water produces Te oxide, which alteration results in a difference in refractive index between the light-irradiated sections and the non-irradiated sections. The light interference grating is recorded by the produced refractive index difference. That is, since the hologram is recorded by the refractive index difference produced simply by light irradiation, no separate developing procedure is necessary. Thus, reproduction is possible immediately after irradiation of the recording light, so that hologram recording and reproduction can be accomplished in a convenient manner. This also eliminates the risk of reduced resolving power associated with the need for developing procedures.

The recording material for holograms 1 is composed mainly of an inorganic metal oxide porous body 2, and such inorganic substances undergo very low volume fluctuations due to heat, so that volume fluctuations resulting from irradiation of the reproduction light or variation in the environmental temperature do not produce volume fluctuations of a level which can reduce the diffraction efficiency of the recording material for holograms 1. Consequently, even when a repeatedly reproduced/recorded medium is stored for long periods, very little corruption of recorded data occurs by reduction in diffraction efficiency with time.

The water functioning as the oxygen donor substance 6 has no ability to oxidize Te under normal circumstances, instead functioning as a substance which only donates oxygen under irradiation of specific recording light. As a result, during storage of the recording material for holograms before recording or of the hologram-recorded material after recording, the water (oxygen donor substance) does not produce any alteration in the metal oxide porous body 2 which could affect reproduction, and the storage stability of the recording material for holograms is therefore extremely excellent.

When $TeO_2$ is selected as a constituent of the metal oxide porous body 2, the recording light used is usually an Nd-YAG laser (wavelength=532 nm). The photon energy of the recording light is approximately 2.33 eV, which is larger than the energy gap before oxidation of Te and smaller than the energy gap after oxidation. Once recording has been accomplished by irradiation of the recording light, therefore, irradiation of reproduction light at the same location will not excite the $TeO_2$, and hence no further alteration will occur in the light-irradiated sections of the metal oxide porous body 2. As a result, corruption of recorded data with repeated reproduction is vastly reduced.

EXAMPLES

The present invention will now be explained in greater detail through the following examples, with the understanding that these examples are in no way limitative on the invention.

[Fabrication of Optical Recording Medium Sample]

First, tellurium tetraisopropoxide (Te $(OCH(CH_3)_2)_4$) was diluted with anhydrous isopropanol ($(CH(CH_3)_2)OH$) to 0.05 $mol/dm^3$, and then further diluted with 1,3-propanediol ($C_3H_6(OH)_2$) to a tellurium tetraisopropoxide content of 10 wt % to obtain a solution. The solution was then dropped onto slide glass and the solvent was evaporated off to obtain a tellurium-containing film. Analysis of the tellurium-containing film by X-ray diffraction revealed only amorphous broad peaks.

The obtained film was then heat treated at 300° C. in a nitrogen gas atmosphere. The heat treated film was analyzed by X-ray diffraction and crystal peaks attributable to $TeO_2$ and Te were observed. A film formed in the same manner was also observed with a scanning electron microscope (SEM), whereby formation of numerous pores with diameters of about 0.1 $\mu m$ was confirmed. The pore diameters varied on the order of 0.1 $\mu m$, but all of the pore diameters were under 0.5 $\mu m$.

Next, the heat treated tellurium-containing film was immersed in water for impregnation of water into the pores, after which the surface of the tellurium-containing film was covered with cover glass and the each edge was sealed with an epoxy adhesive to obtain a sample of a recording material for holograms.

[Measurement of Changes in Refractive Index with Laser Irradiation and Thermal Expansion Coefficient]

The obtained sample of a recording material for holograms was spot irradiated using an Nd-YAG laser (wavelength: 532 nm). After irradiation, the laser-irradiated section was visually confirmed to have increased transparency. The irradiated section was removed out and analyzed by X-ray diffraction, which confirmed the disappearance of the crystal peak for Te.

Measurement of the refractive indexes of the laser-irradiated section and non-irradiated section with an ellipsometer (DVA-362 Automatic Ellipsometer by Mizojiri Optical Co., Ltd) yielded results of n=1.8 for the irradiated section and n=2.0 for the non-irradiated section. The thermal expansion coefficient after laser irradiation of the optical recording medium sample was also calculated from the degree of shift of the interference pattern projected onto an image sensor when irradiating laser light onto the sample sandwiched between two reflecting mirror surfaces moving in parallel (Measured with a laser thermal dilatometer. Measuring principle: double-optical-path Michelson interference), and the change in the sample thickness was found to be approximately $1 \times 10^{-5}/deg$.

These results indicated that the recording material for holograms according to the invention produces an adequately large refractive index difference between light-irradiated sections and non-irradiated sections, and that the light irradiation-induced thermal expansion was not of a level affecting the diffraction efficiency.

As explained above, a recording medium for holograms employing a recording material for holograms according to the present invention is capable of reproduction immediately after recording, and because its volume fluctuations caused by reproduction light irradiation-produced heat or changes in environmental temperature are not significant, the corruption of recorded data with time is negligible. Moreover, the recording medium for holograms also allows multiplex recording and has notably improved recording density.

What is claimed is:

1. A recording material for holograms comprising a metal oxide porous body, the metal oxide porous body including a plurality of pores defined by an outer boundary of the metal oxide porous body and the porous maintaining oxygen donor substance beyond the outer boundary of the metal oxide porous body.

2. A recording material for holograms according to claim 1,
wherein said metal oxide porous body has an increased oxygen content with oxygen from said oxygen donor substance generated by irradiation of recording light composed of a signal beam and a reference beam.

3. A recording material for holograms according to claim 2,
wherein said oxygen content increase in the absence of irradiation of said recording light is below a level which is detectable by reproduction light.

4. A recording material for holograms according to claim 2,
wherein said metal oxide porous body is a metal oxide porous body capable of transmitting said recording light.

5. A recording material for holograms according to claim 1,
wherein at least a portion of the surface of said metal oxide porous body in contact with said oxygen donor substance consists of said metal oxide capable of increased oxygen content and/or the constituent metal element of said metal oxide.

6. A recording material for holograms according to claim 1,
wherein said oxygen donor substance is water.

7. A recording material for holograms according to claim 1,
wherein the constituent metal element of said metal oxide porous body is at least one metal element selected from the group consisting of B, Mg, Al, Ca, Ti, Cr, Zn, Sr, Zr, Nb, Mo, Sn, Sb, Te, Ba, La, Ce, Nd, Eu, Gd, Tb, Dy, Ho, Er, Tu, Yb and Lu.

8. A recording material for holograms according to claim 1,
wherein said metal element is Te.

9. A recording medium for holograms provided with a least a substrate material and a recording layer formed on said substrate material, wherein said recording layer comprises a recording material for holograms according to claim 1.

10. A hologram recording method which comprises:

a recording step in which the recording layer of a recording medium for holograms according to claim 9 is irradiated with recording light composed of a signal beam and a reference beam to increase the oxygen content of said metal oxide porous body with oxygen from said oxygen donor substance generated by irradiation of said recording light in said recording layer.

11. A hologram recording method according to claim 10, wherein the irradiation angle of said recording light on said recording layer is varied to increase said oxygen content of said metal oxide porous body in the direction of depth of said recording layer based on each irradiation angle.

12. A hologram reproduction method which comprises:

a reproduction step in which a recording medium for holograms obtainable by a hologram recording method according to claim 10 is irradiated with reproduction light.

13. A method for manufacturing a recording material for holograms comprising a metal oxide porous body provided with an oxygen donor substance in the pores which comprises:

a step of forming a metal oxide porous body from a metal oxide precursor, and after the step of forming said metal oxide porous body, a step of supplying an oxygen donor substance to the pores of said metal oxide porous body.

14. A method for manufacturing a recording material for holograms according to claim 13, wherein said oxygen donor substance is water.

15. A method for manufacturing a recording material for holograms according to claim 13, wherein said precursor is a metal alkoxide.

16. A method for manufacturing a recording material for holograms according to claim 13, wherein said precursor is tellurium alkoxide.

17. A recording material for holograms obtainable by a method for manufacturing according to claim 13.

18. A recording medium for holograms provided with at least a substrate material and a recording layer formed on said substrate material, wherein said recording layer comprises a recording material for holograms according to claim 17.

19. A hologram recording method which comprises:

a recording step in which the recording layer of a recording medium for holograms according to claim 18 is irradiated with recording light composed of a signal beam and a reference beam to increase the oxygen content of said metal oxide porous body with oxygen from said oxygen donor substance generated by irradiation of said recording light in said recording layer.

20. A hologram recording method according to claim 19, wherein the irradiation angle of said recording light on said recording layer is varied to increase said oxygen content of said metal oxide porous body in the direction of depth of said recording layer based on each irradiation angle.

21. A hologram reproduction method which comprises:

a reproduction step in which a recording medium for holograms obtainable by a hologram recording method according to claim 19 is irradiated with reproduction light.

* * * * *